(12) United States Patent
Bowers

(10) Patent No.: US 6,500,758 B1
(45) Date of Patent: Dec. 31, 2002

(54) METHOD FOR SELECTIVE METAL FILM LAYER REMOVAL USING CARBON DIOXIDE JET SPRAY

(75) Inventor: Charles W. Bowers, Livermore, CA (US)

(73) Assignee: Eco-Snow Systems, Inc., Livermore, CA (US)

( * ) Notice: Subject to any disclaimer, the term of this patent is extended or adjusted under 35 U.S.C. 154(b) by 99 days.

(21) Appl. No.: 09/660,354

(22) Filed: Sep. 12, 2000

(51) Int. Cl.[7] .............................................. H01L 21/28
(52) U.S. Cl. ...................................................... 438/669
(58) Field of Search ................................ 438/670, 669, 438/951, FOR 347, FOR 405, FOR 455; 148/DIG. 100

(56) References Cited

U.S. PATENT DOCUMENTS

| | | | |
|---|---|---|---|
| 4,448,800 A | * | 5/1984 | Ehara et al. ................... 427/39 |
| 4,631,250 A | | 12/1986 | Hayashi |
| 4,655,847 A | | 4/1987 | Ichinoseki et al. |
| 4,662,989 A | | 5/1987 | Casey et al. |
| 4,747,421 A | | 5/1988 | Hayashi |
| 4,806,171 A | | 2/1989 | Whitlock et al. |
| 4,871,651 A | | 10/1989 | McCune, Jr. et al. |
| 4,924,643 A | | 5/1990 | Buiguez et al. |
| 4,962,891 A | | 10/1990 | Layden |
| 4,977,910 A | | 12/1990 | Miyahara et al. |
| 5,044,129 A | | 9/1991 | Olevitch |
| 5,062,898 A | | 11/1991 | McDermott et al. |
| 5,063,015 A | | 11/1991 | Lloyd et al. |
| 5,125,979 A | | 6/1992 | Swain et al. |
| 5,129,198 A | | 7/1992 | Kanno et al. |
| 5,315,793 A | * | 5/1994 | Peterson et al. ............... 51/415 |
| 5,378,312 A | * | 1/1995 | Gifford et al. ............... 156/643 |
| 5,705,432 A | * | 1/1998 | Lee et al. ................... 437/228 |
| 5,766,061 A | | 6/1998 | Bowers |
| 5,766,368 A | | 6/1998 | Bowers |
| 5,853,962 A | | 12/1998 | Bowers |
| 6,335,208 B1 | * | 1/2002 | Lowry ............................ 438/4 |

OTHER PUBLICATIONS

S. A. Hoenig, Cleaning Surfaces with Dry Ice, Compressed Air Magazine, Aug. 1986, pp. p pp. 22–25.
R. V. Peterson, C. W. Bowers, Contamination Removal by $CO_2$ Jet Spray, SPIE, Optical System Contamination: Effects, Measurement, Control II, 1990, pp. 72–85, vol. 1329, San Diego, CA.

(List continued on next page.)

Primary Examiner—George Fourson
Assistant Examiner—Suk San Foong
(74) Attorney, Agent, or Firm—R. Craig Armstrong; Borden Ladner Gervais LLP

(57) ABSTRACT

A method for the selective removal of the metal film layer accumulated upon a photoresist layer during processing of substrates using a stream of carbon dioxide spray without disturbing conductor portions is provided. A constant stream of high pressure $CO_2$ snow is applied to the metal film layer thereby rapidly cooling the metal layer on top of said resist layer causing it to shrink rapidly, and to debond, and peel from the photoresist layer underneath. The temperature of the substrate is raised and maintained at significantly higher than room temperature. Continuing the application of the $CO_2$ spray causes thermal shock to the photoresist under the metalized layer causing large cracks in the remaining metal layer portions, said cracks typically including at least one loose metal edge. The $CO_2$ spray is continually applied to the cracks thereby peeling away the remaining metal portions, leaving the exposed photoresist and underlying surface features. Preferably, continued treatment of the surface with $CO_2$ snow particles erodes a surface layer of the photoresist and heavily cross-linked layers created during the metalization process. After the metal layer and the surface layer of the photoresist are removed, a simple chemical strip, such as acetone, completely removes all the remaining resist, leaving the wafer with undamaged conductor portions.

12 Claims, 4 Drawing Sheets

OTHER PUBLICATIONS

R. Sherman, W. Whitlock, The Removal of Hydrocarbons and Silicone Grease Stains from Silicon Wafers, Journal of Vacuum Science Technology, May/Jun. 1990, pp. 563–567, B 8 (3), American Vacuum Society.

R. R. Zito, Cleaning Large Optics with $CO_2$ Snow, SPIE, Advanced Technology Optical Telescopes IV, 1990, pp. 952–971, vol. 1236, San Diego, CA.

R. C. Loveridge, $CO_2$ Jet Spray Cleaning of IR Thin Film Coated Optics, SPIE $36^{th}$ International Symposium, Optical and Optoelectronic Applied Science and Engineering, Jul. 1991, San Diego, CA.

L. Layden, D. Wadlow, High Velocity Carbon Dioxide Snow for Cleaning Vacuum System Surfaces, Journal of Vacuum Science Technology, Sep./Oct. 1990, pp. 3881–3883, A8 (5), American Vacuum Society.

S. A. Hoenig, The Application of Dry Ice to the Removal of Particulates from Optical Apparatus, Spacecraft, Semiconductor Wafers and Equipment used in Contaminant Free Manufacturing Processes, Sep. 1985, pp. 1–7; diagrams 1–11.

* cited by examiner

METHOD FOR SELECTIVE METAL FILM LAYER REMOVAL USING CARBON DIOXIDE JET SPRAY

BACKGROUND OF THE INVENTION

1. Field of the Invention

This invention relates to a method for the selective removal of the metal film layer accumulated during "lift off" processing of substrates including wafers, integrated circuits, masks and the like using a stream of carbon dioxide spray.

2. Description of the Prior Art

In the processing of integrated circuits and the like, a common method for forming a patterned conductor layer on a substrate is a process which typically involves depositing a photoresist layer on the substrate which is patterned such that the photoresist layer covers the portions of the substrate which will not have the coating of conductor material. The photoresist layer, is generally exposed and developed such that when a metal layer is subsequently exposed over the entire surface, the portion of the metal layer deposited on the top of the photoresist layer is discontinuous from that deposited directly on the substrate (the conductor portions). This discontinuity is typically achieved by developing the pattern side walls of the photoresist defining uncovered areas with an undercut profile. To complete the patterning process, it is then necessary to remove the unwanted metal layer deposited upon the photoresist layer and subsequently the photoresist layer itself, leaving the conductor portions intact on the substrate.

The prior art reveals numerous methods for removal of the metal and photoresist layers during such processing. Prior known conventional methods involved soaking the substrates for many hours in a suitable solution before the desired metal layer could be removed so that the solution could penetrate the photoresist through the side walls since access to the photoresist is significantly blocked by the metal layer. Various methods are taught which attempt to increase the speed by which these layers may be removed. For example, U.S. Pat. No. 4,662,989 to Casey et al. teaches the application of an additional layer of material which has sufficiently different thermal expansion properties on the metal film layer so as to induce stress and cause cracks in the metal film layer for improved solvent penetration and thus more efficient and quicker dissolving of the photoresist layer.

U.S. Pat. No. 4,871,651 to McCune Jr. et al. involves subjecting an entire substrate to sufficiently low temperatures preferably by means of immersion in a bath of liquid nitrogen and thus extreme thermal stress so as to cause removal of the unwanted metal and photoresist layers due to the different thermal expansive properties of the photoresist layer versus the substrate, causing tensile cracking at the photoresist/substrate interface. Although the McCune Jr. process takes a shorter period of time than the prior conventional solvent soaking methods, it subjects the entire substrate to extremely low temperature and thus significant stress. The McCune process may also require a drying step to remove the condensation after the substrate is removed from the nitrogen bath. McCune also does not provide a method to dispose of the metal after removal which may result in the nitrogen bath becoming saturated with metal particles and thus cause the potential for metal redisposition on the substrate.

U.S. Pat. No. 4,631,250 to Hayashi teaches a process for removing covering films from the surface of a substrate by blasting the film with a spray of $CO_2$ particles. In order to achieve the required force and abrasive properties to remove the film layers, the $CO_2$ is cooled and accelerated by mixing same with N2 gas at the spray source. The $CO_2$ particles may be further mixed with fine ice particles to increase the abrasive properties of the spray. The method disclosed in Hayashi may be suitable for removing a baked photoresist mask from a substrate surface, however, the $CO_2$ particle bombardment disclosed in Hayashi would be far too damaging to the metal conductor portions since would tend to undesirably and indiscriminately remove the metal conductor portions given its force and abrasive properties.

In light of the prior art described above, there is a need for an improved process to selectively remove the metal layer accumulated during lift off patterning process while not damaging the conductor portions.

SUMMARY OF THE INVENTION

It is an object of the invention to provide an improved process to selectively remove the metal layer accumulated on the photoresist layer during the wafer patterning process while not damaging the deposited the metal conductor portions.

In accordance with an aspect of the invention, there is provided a process for selectively removing a metal layer accumulated on a photoresist layer during substrate patterning process comprising the following steps:generating a stream of high pressure $CO_2$ snow; providing a substrate including a photoresist layer, a metal film layer on top of said photoresist layer and metal conductor portions; said metal film layer and metal conductor portions being of like composition and being discontinuous from each other; said metal conductor portions being in contact with said substrate surface; applying said stream to said metal film layer thereby rapidly cooling said metal layer and causing portions of said metal layer to debond, lift and peel from said photoresist layer while leaving said metal conductor portions intact.

The application of said stream to said metal layer causes thermal shock to said photoresist layer producing a plurality of cracks in the surface of said metal layer. The cracks typically including at least one loose metal edge.

Preferably further steps are provided as follows: directing said stream at said cracks and preferably said metal edge such that said stream causes further portions of said metal layer to debond, lift and peel away from said photoresist layer; and continuing application of said spray to said substrate until the entire metal layer is removed from said photoresist layer.

The further step of further continuing application of said spray to said photoresist layer, thereby removing a surface layer of said photoresist layer and leaving a remaining resist layer may also be provided. Preferably, continued treatment of the surface with $CO_2$ snow particles erodes the photoresist and thus removes any heavily cross-linked layers created during the metalization process.

In accordance with yet a further aspect of the invention, preferably the temperature of the substrate is raised and maintained at significantly higher than environmental temperature. By keeping the substrate at this elevated temperature, the $CO_2$ spray will cause removal of the metal film layer upon the photoresist layer and encourage the photoresist layer to be removed while keeping the metal conductor portions attached directly to the substrate in tact given that the metal attached directly to the substrate has good thermal contact and thus maintains its temperature, whereas the metal and photoresist layers do not and thus are caused to cool and differentially shrink, and/or crack and peel and thus be removed.

The portions of metal layer and/or photoresist layer removed may be collected in a filter.

Preferably after the metal layer and the surface layer of the photoresist are removed, a photoresist strip such as a simple chemical strip, such as acetone, NMP, or a dry ashing process completely removes all the remaining photoresist, leaving the substrate with undamaged conductor portions.

An advantage of the invention is that the process causes rapid removal of the metal film layer which accumulates on the photoresist layer during the forming of patterned metal conductor layers on substrates without damaging the metal conductor portions. This is achieved without the inclusion of additional materials such as an additional metal layer for causing microcracks in the metal layer, nor without exposing the entire substrate to extreme stress such as that caused by immersion in an N2 bath or subjecting the entire wafer to low temperatures. A further advantage is that the process eliminates the metal stringers and veils usually associated with metal lift-off of thick metal films or extremely narrow and closely spaced metal lines. The process also removes the heavily cross-linked skin layer, textures, and induces cracks in the underlying photoresist, thus promoting faster solvent absorption and rapid removal of the photoresist. When incorporating the dry ashing process above as the photoresist strip, the invention provides the significant advantage of being a completely dry process.

Further features of the invention will be described or will become apparent in the course of the following detailed description.

BRIEF DESCRIPTION OF THE DRAWINGS

In order that the invention may be more clearly understood, the preferred embodiment thereof will now be described in detail by way of example, with reference to the accompanying drawings, in which.

DETAILED DESCRIPTION

Figure 1:
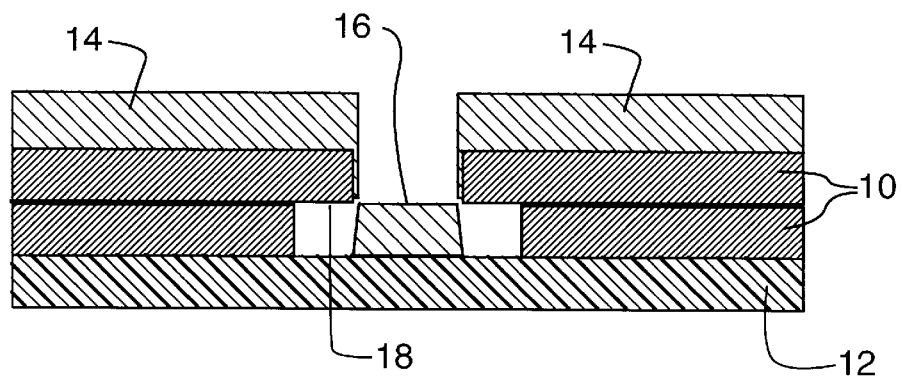
FIG. 1 is a schematic drawing of a typical patterned wafer after the metalization step.

Shown in FIG. 1 is a typical wafer to which the typical lift off process is applied for forming a patterned conductive layer. In the lift off process, at least one layer of photoresist material 10 is deposited on the portions of a wafer substrate 12 which are not to have the conductor material positioned on the substrate. The photoresist layer is exposed and developed in such a way that once metal film material is deposited over the entire substrate surface in the metallization step, the metal film layer 14 deposited on top of the photoresist layer will be discontinuous with the metal conductor portions 16 which are deposited directly onto the substrate. This will allow for subsequent removal of the metal film layer 14 on top of the photoresist layer while keeping the metal conductor portions 16 in tact upon the substrate, as is desired in the patterning process.

The discontinuity between metal conductor portions 16 and metal layer 14 is preferably achieved by applying the photoresist layer such that the side walls 18 of the photoresist defining uncovered areas of the substrate 12 have an undercut profile. The next step is the addition of the metal conductor material deposited over the entire surface. Because the side walls of the photoresist have an undercut profile, the desired discontinuity between the layer of deposited metal 14 on top of the photoresist layer 10 and the metal conductor portions 16 applied directly to the substrate is achieved.

Preferably an ECO-SNOW™ $CO_2$ Jet Spray System may be used to generate and apply the carbon dioxide jet spray or snow by feeding pressurized liquid carbon dioxide stored in a source tank through a jet spray nozzle and orifice assembly at the above noted predetermined pressure. The details of the means for generating and applying the carbon dioxide snow and examples of permissible $CO_2$ cleaning/processing assemblies are fully described in U.S. Pat. No. 5,315,793 entitled "System for Precision Cleaning By Jet Spray" and U.S. Pat. No. 5,326,560 entitled "Environmental Control Apparatus" which are assigned to the assignee of the present invention, the contents of which are incorporated herein by reference. Although these patents teach cleaning assemblies, they may also be utilized for the processing of the herein invention.

In particular, the process of the herein invention was tested using an ECO-SNOW™ $CO_2$ Jet Spray System namely the ECO-SNOW™ ACS 1600 Jet Spray System of the assignee. During said test, a GaAs wafer was maintained at 60 degrees Celcius. The tested wafer included a photoresist layer in the neighbourhood of 0.97 microns thick and a metal layer comprised of titanium (250 Ang) platinum (500 Ang) and gold (5200 Ang).

Figure 2:
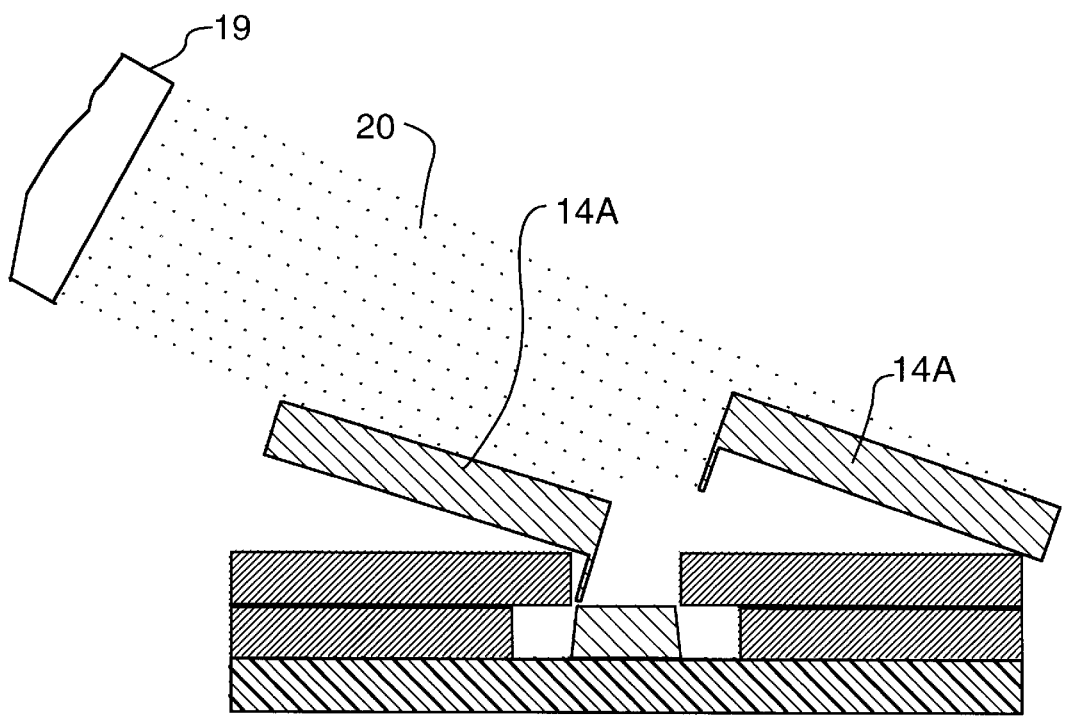
FIG. 2 is a schematic drawing showing the application of $CO_2$ spray to the metal layer of a typical patterned wafer and initial stage debonding of metal film layer.
Figure 3:
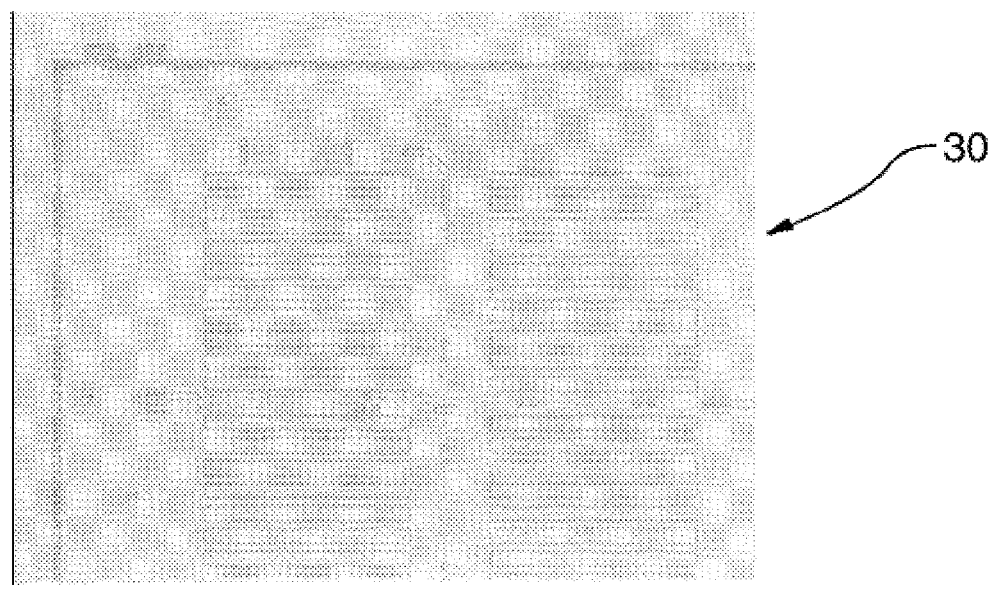
FIG. 3 is a photomicrograph showing a wafer after metalization prior to applying the preferred process of the present invention.
Figure 4:
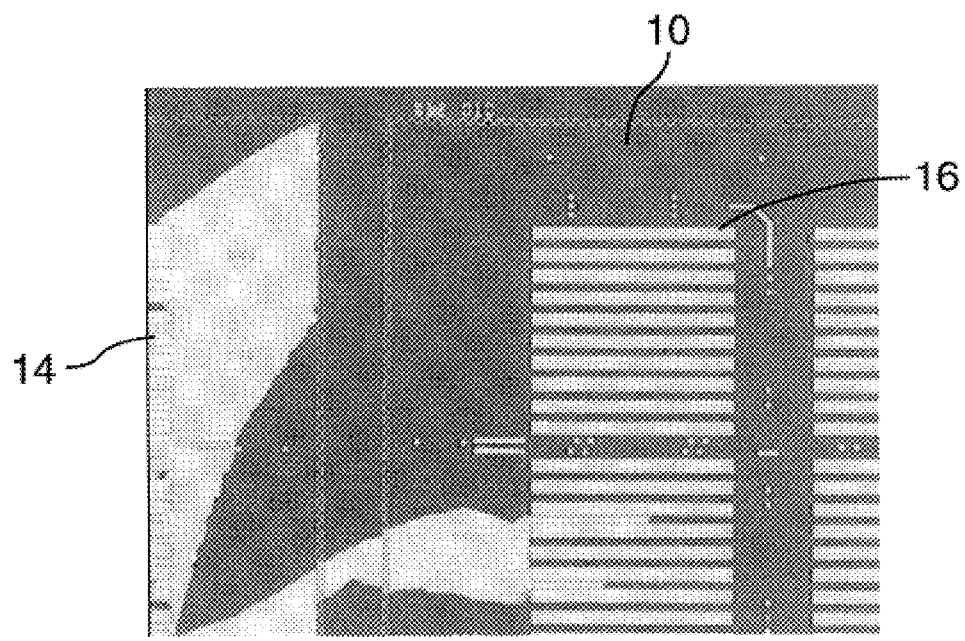
FIG. 4 is a photomicrograph showing the initial peeling action of the $CO_2$ snow spray as a portion of the metal layer on top of the photoresist is removed using a preferred process of the present invention.

Shown schematically in FIGS. 1 and 2, the substrate 12 is preferably disposed in the cleaning assembly (not shown). A nozzle orifice assembly 19 which emits the snow spray is directed at the surface of the substrate and its metal film layer 14, preferably oriented at an angle of 30 degrees. The angle may be varied within the range of 10 to 40 degrees. The carbon dioxide spray 20 causes a mismatch in the thermal coefficient of expansion of the metal film layer 14 and photoresist layer 10 causing portions 14a of the metal layer to debond from the photoresist layer 10. The momentum transfer between the gas particles of the spray 20 and debonded metal layer portions 14a sweeps the debonded metal portions 14a from the surface of the photoresist. Shown in FIGS. 3 and 4 are photomicrographs of the test wafer 30 subjected to lift off patterning processing (including conductor portions 16, metal 14 and photoresist layers 10). FIG. 4 illustrates the initial peeling action of the $CO_2$ snow spray as a portion of the metal layer 14 on top of the photoresist layer 10 is removed.

Figure 5:
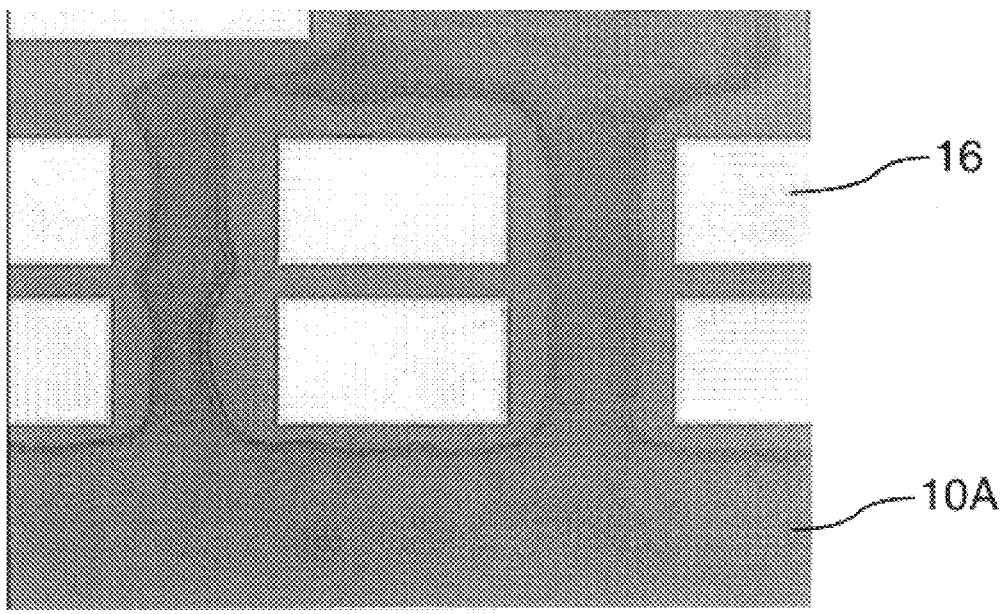
FIG. 5 is a photomicrograph showing the undercut area that has been exposed by applying a preferred process of the present invention.

Continued application of the $CO_2$ snow induces thermal shock to the photoresist layer which tends to cause large cracks in any metal portions left after the initial peel of the metal layer 14. Typically these large cracks include a metal edge 34, at which the spray is then preferably directed. The $CO_2$ stream is directed at the cracks in the remaining metal layer at the preferred angle of 30 degrees, causing said peeling of remaining portions of metal and initiation of the removal of portions of photoresist. Shown in FIG. 5 is a photomicrograph of a portion of the test wafer 30 after the metal layer has been removed using the process of the herein invention. Further continued application of the $CO_2$ snow will erode the photoresist layer 10 and remove any crosslinked layers developed during the metallization process.

Figure 6:
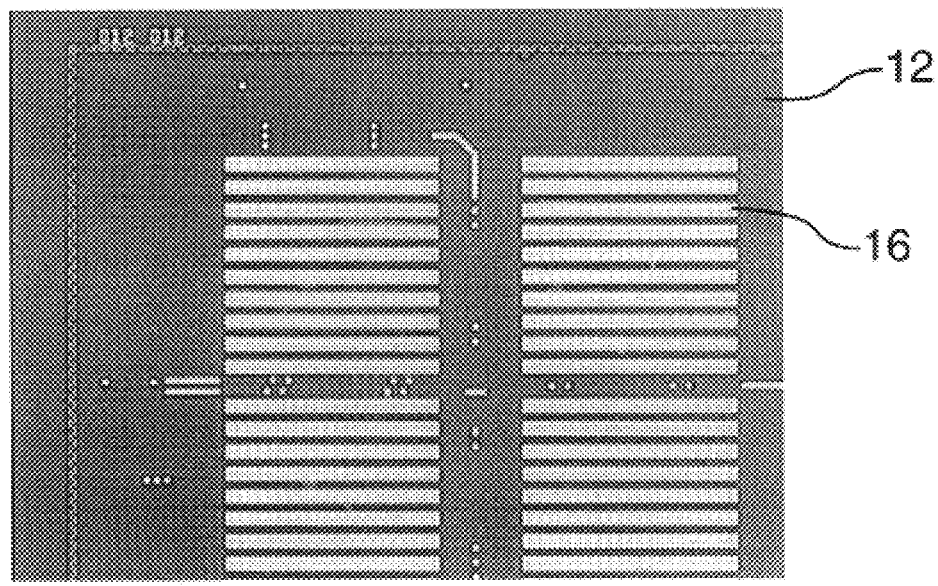
FIG. 6 is a photomicrograph of a wafer after the preferred process of the present invention and after chemical strip of residual photoresist.

Remaining portions of photoresist layer 10a may be removed by a photoresist strip which may be a simple chemical strip such as acetone completely removing all the remaining photoresist portions. This may also be at least partially achieved by the further application of $CO_2$ spray. Shown in FIG. 6 is a photograph of the metalized wafer surface of the test wafer after application of the $CO_2$ spray and after chemical strip of residual photoresist. The photoresist strip may also be achieved by dry ashing, a process known to those skilled in the art which ensures that recondensation does not occur on the substrate surface. If in fact the dry ashing process is utilized as the photoresist strip, the process is completely dry, thus enhancing the processes efficiency.

As opposed to previous known wafer cleaning processes, during the entire process described above, the substrate is preferably heated to approximately 60 degrees Celsius and is maintained at said temperature during the entire $CO_2$ spraying removal process by means of a heater, in the test case a 750 watt electric heater, keeping a constant heat source on the substrate. Keeping the temperature at an elevated temperature facilitates the thermal stress necessary to initiate cracking and debonding of the metal film upon the photoresist without causing disruption of the metal conductor portions situated directly on the wafer. Selective removal of the metal film will be effective if the wafer is maintained in the range of 30 to 100 degrees Celsius. Without this elevated temperature, the selective removal of the film layer would not be effective given that the differential in thermal expansion between the photoresist layer and the metal layer is noticeably enhanced where the difference between the carbon dioxide jet spray temperature and substrate temperature is in the range of 100 degrees Celsius.

Figure 7:
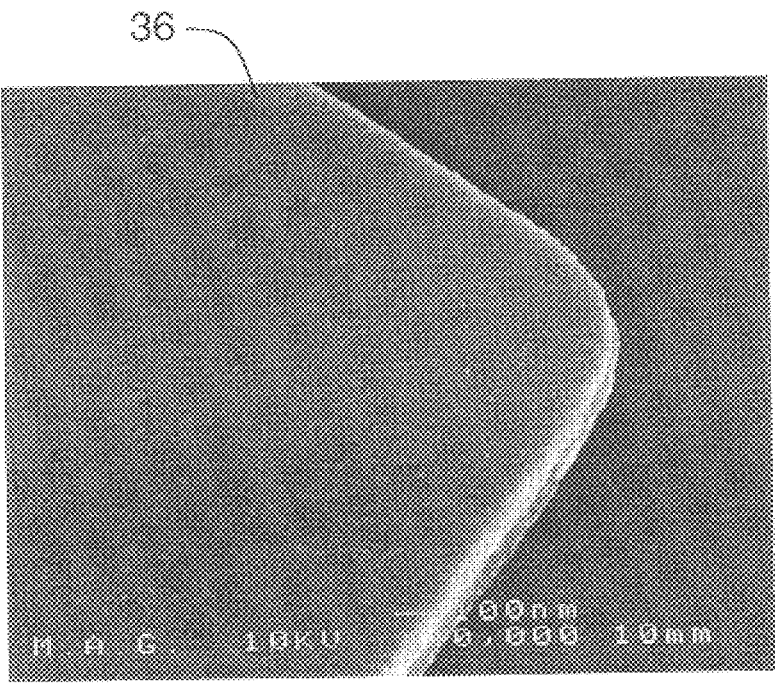
FIG. 7 is a SEM photograph of an edge of a gold metal conductor portion confirming that there has been no damage to the device after subjection to the preferred process of the present invention.
Figure 8:
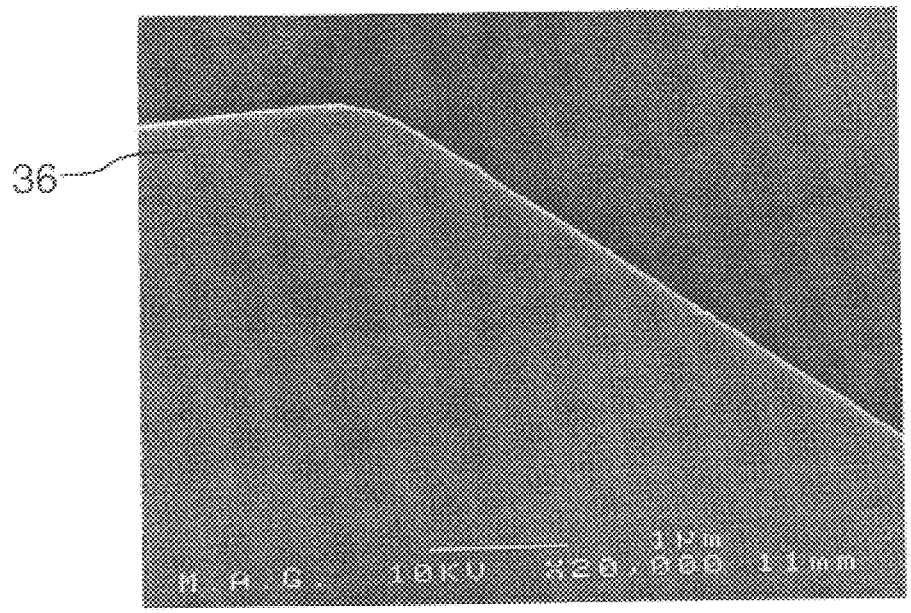
FIG. 8 is a SEM photograph of an edge of a gold metal conductor portion subjected to the preferred process of the present invention.

The test wafer subjected to the preferred process of the herein invention showed that the metal conductor portion remained intact and undamaged during metal film removal process described above. For example, FIGS. 7 and 8 are scanning electron micrograph (SEM) photographs showing that gold conductor portions 36 on the test wafer have been subjected to the process of the present invention and are undamaged.

Further in accordance with the preferred process, the debonded and peeled metal portions may be collected by a high efficiency particulate air filter (HEPA) or an ultra low particulate air (ULPA) filter for removal and disposal. Likewise so to may the photoresist layer removed by the $CO_2$ spray.

It will be appreciated that the above description relates to the preferred embodiment by way of example only. Many variations on the invention will be obvious to those knowledgeable in the field, and such obvious variations are within the scope of the invention as described and claimed, whether or not expressly described.

For example other cryogenic materials such as nitrous oxide, argon and xenon for example may be used in place of carbon dioxide in practising the present invention. The temperature of the substrate to be processed may be manipulated in any way which allows for selective removal of the metal film layer while keeping conductor portions in tact.

Any apparatus may be used to deliver the required cryogenic spray, not necessarily the ECO-SNOW Wafer cleaning systems described herein. The process of the herein invention has been demonstrated to work effectively with various metals such as gold, silver, platinum, titanium, and copper and may be utilized to remove film layers comprised of any suitable metal know to persons skilled in the art of semiconductor manufacturing. The process of the herein invention may further be utilized with negative development, positive development and "Low K" photoresist layer and any other permissible photoresist layer known to persons skilled in the art of semiconductor manufacturing.

What is claimed as the invention is:

1. A process for selectively removing a metal film layer from a substrate, the metal film layer accumulated on the substrate during a substrate patterning process, the substrate having metal conductor portions in contact with the substrate and a photoresist layer, the metal film layer being on a surface of the photoresist layer opposite the substrate, the metal film layer and metal conductor portions being of like composition and being discontinuous from each other, the process comprising:

generating a stream of high pressure $CO_2$ snow; and applying the stream to the metal film layer for rapid cooling of the metal film layer and for causing portions of the metal film layer to debond, lift and peel from the photoresist layer while leaving the metal conductor portions intact.

2. The process of claim 1 wherein applying the stream to the metal film layer further comprises applying the stream to the metal film layer for causing thermal shock to the photoresist layer and for producing a plurality of cracks in a surface of the metal film layer, and the process further comprising:

directing the stream at the cracks for causing further portions of the metal film layer to debond, lift and peel from the photoresist layer; and continuing to apply the spray to the substrate until the entire metal film layer is removed from the photoresist layer.

3. The process of claim 2 further comprising further applying the spray to the photoresist layer for removing a surface layer of the photoresist layer while leaving a remaining photoresist layer.

4. The process of claim 3 further comprising applying a photoresist strip to the remaining photoresist layer for removing the remaining photoresist layer while leaving the metal conductor portions intact.

5. The process of claim 4 wherein the photoresist strip is a chemical strip.

6. The process of claim 5 wherein the chemical strip is acetone.

7. The process of claim 4 wherein the photoresist strip comprises a dry ashing process.

8. The process of claim 1 further comprising the preliminary step of disposing the substrate in an enclosed processing assembly.

9. The process of claim 1 further comprising collecting the debonded metal film layer portions in a filter.

10. The process of claim 1 wherein the raised temperature is 60 degrees Celsius.

11. The process of claim 1 wherein the stream is applied to the metal film layer at an angle in the range of 10 to 40 degrees with respect to the top surface of the substrate.

12. The process of claim 1 wherein the stream is applied to the metal film layer at an angle of 30 degrees.

* * * * *

UNITED STATES PATENT AND TRADEMARK OFFICE
CERTIFICATE OF CORRECTION

PATENT NO.    : 6,500,758 B1
DATED         : December 31, 2002
INVENTOR(S)   : Charles W. Bowers It is certified that error appears in the above-identified patent and that said Letters Patent is hereby corrected as shown below:

<u>Column 6,</u>
Line 20, replace "of like" with -- the same --.
Line 24, delete "high pressure"
Line 24, delete "and".
Line 25, delete "rapid".
Line 29, after "intact", insert -- ; rasing the temperature of the substrate and maintaining the temperature of the substrate in the range of 30 to 100 degrees Celsius --.
Line 65, after "30 degrees", insert -- with respect to the top surface of the substrate --.

Signed and Sealed this

Fifth Day of August, 2003

JAMES E. ROGAN
*Director of the United States Patent and Trademark Office*